Figure 1:
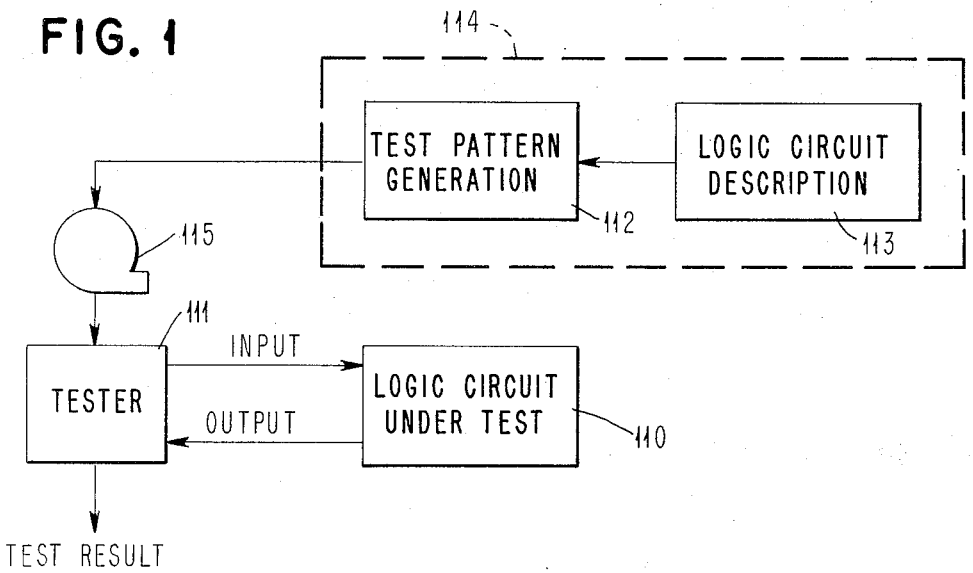
Figure 7:
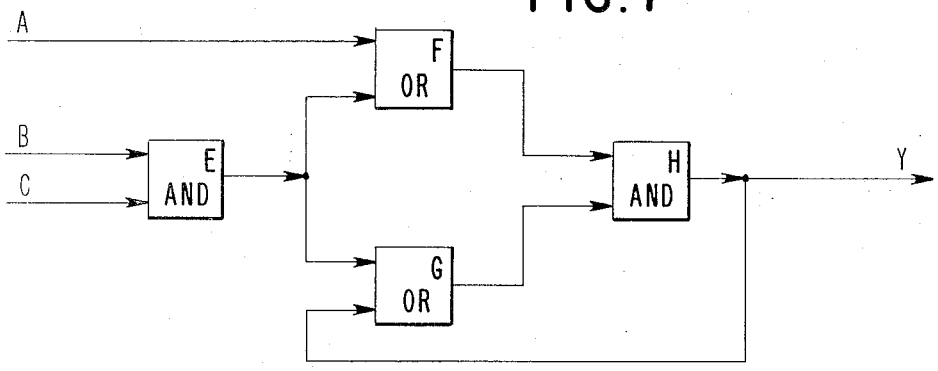
Figure 8:
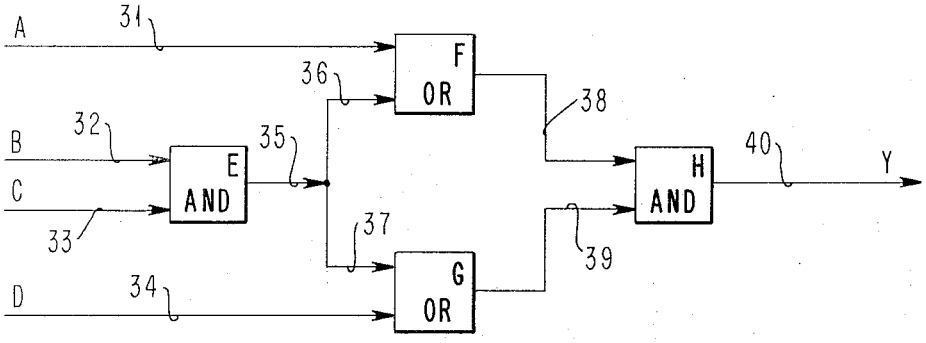
Figure 2:
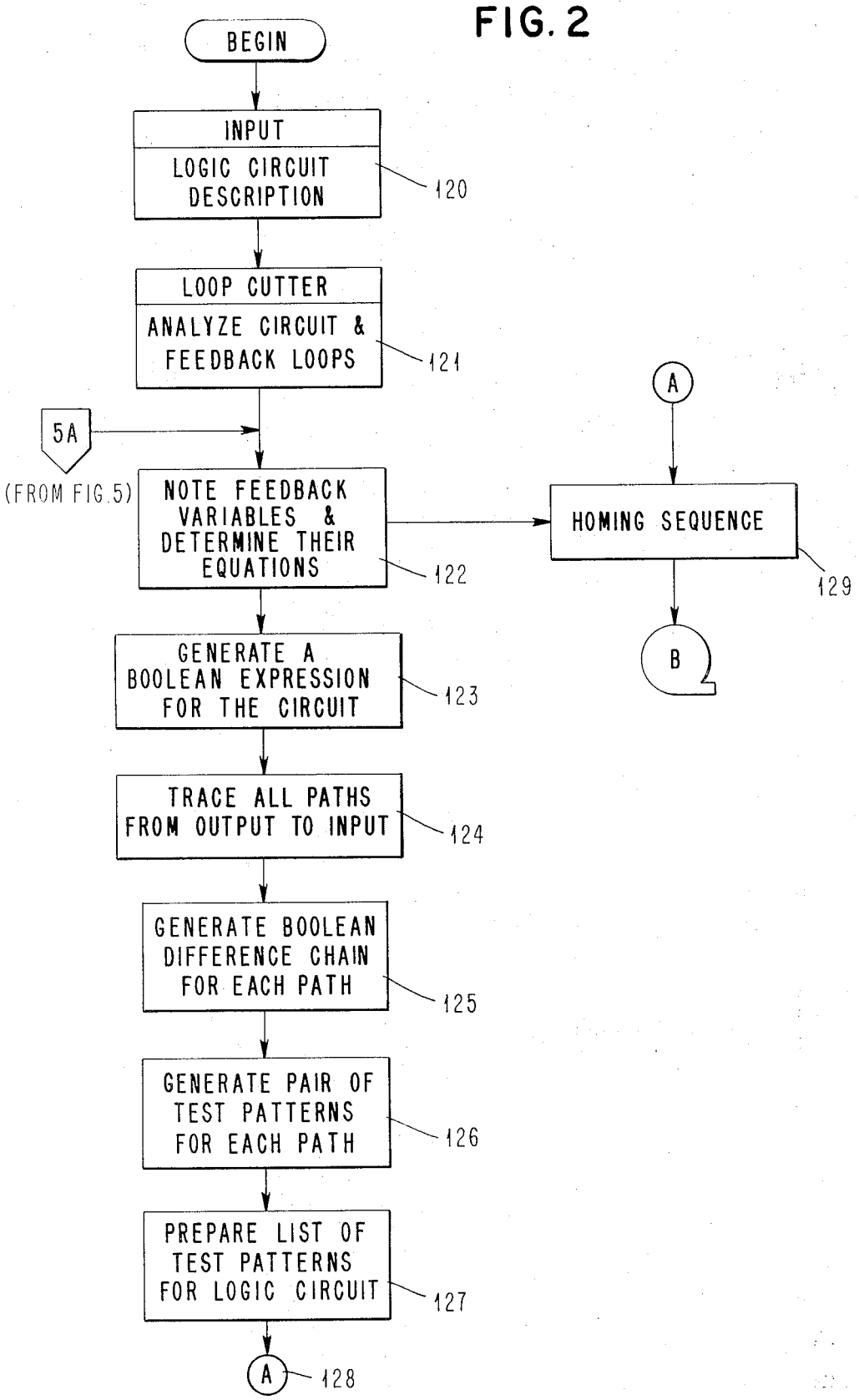
Figure 3:
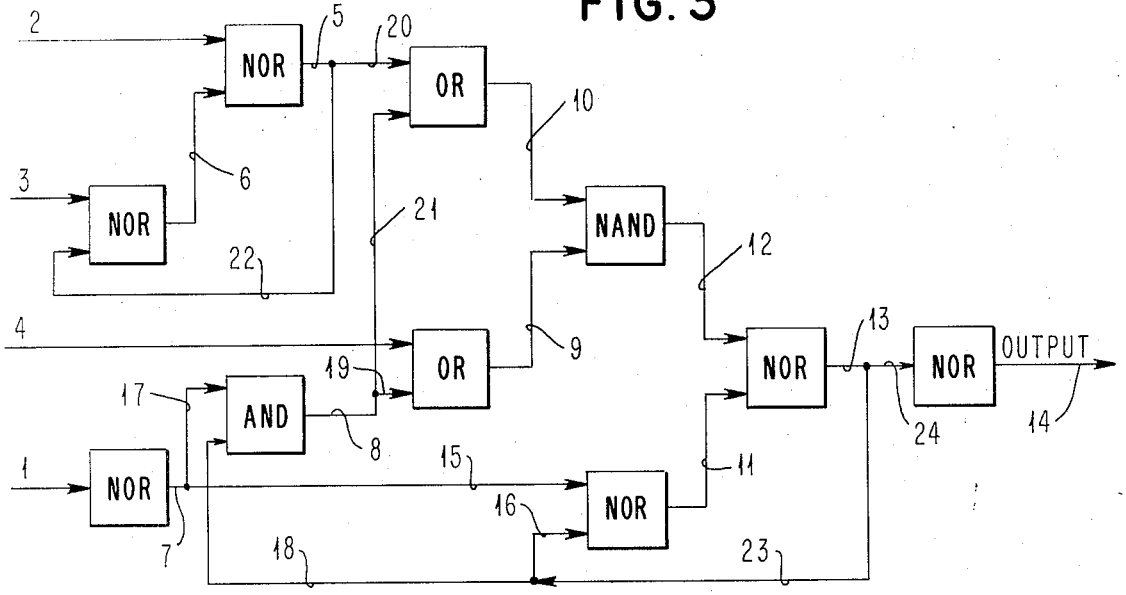
Figure 4:
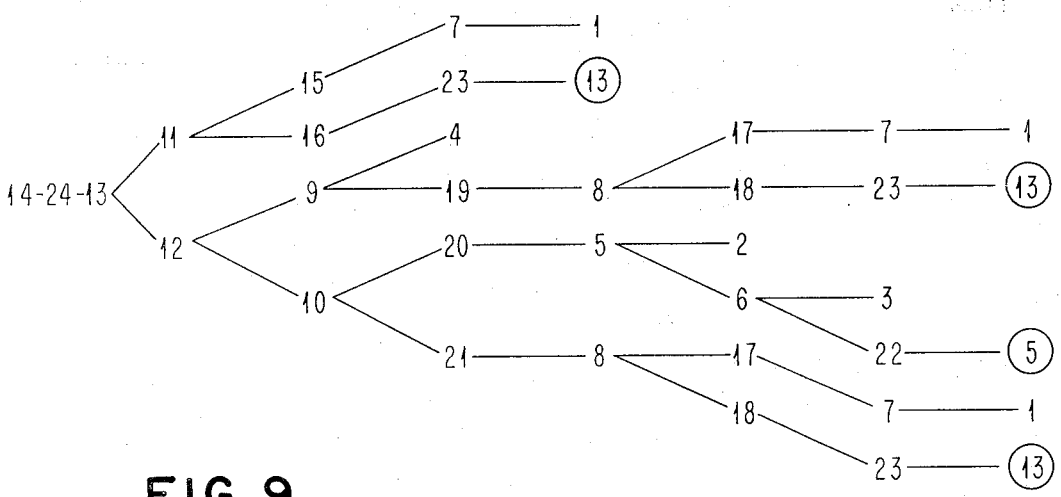
Figure 9:
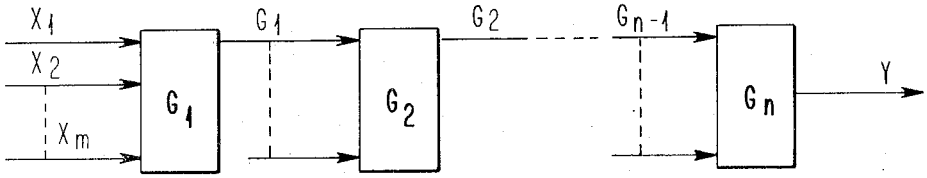
Figure 5:
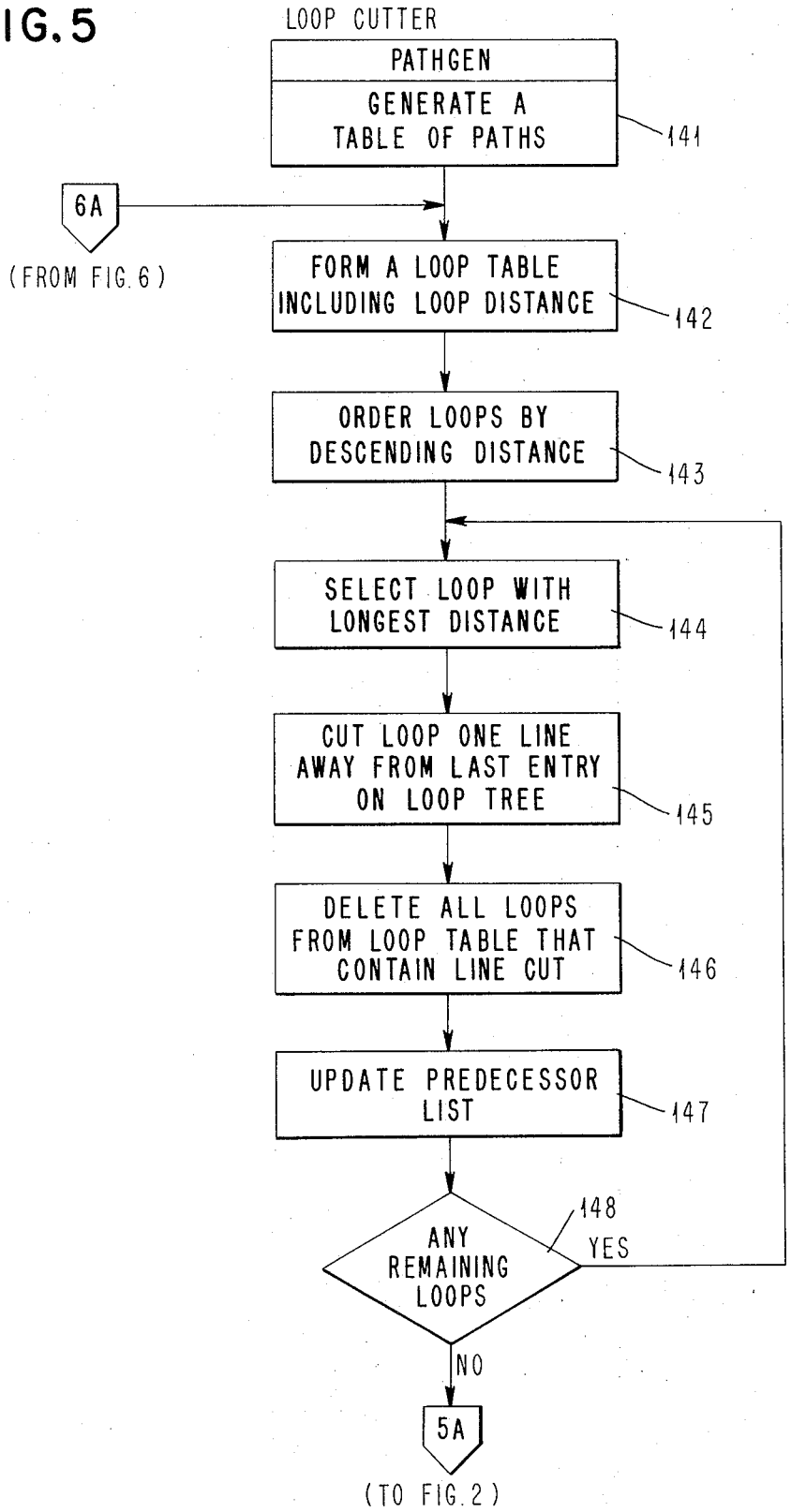
Figure 6:
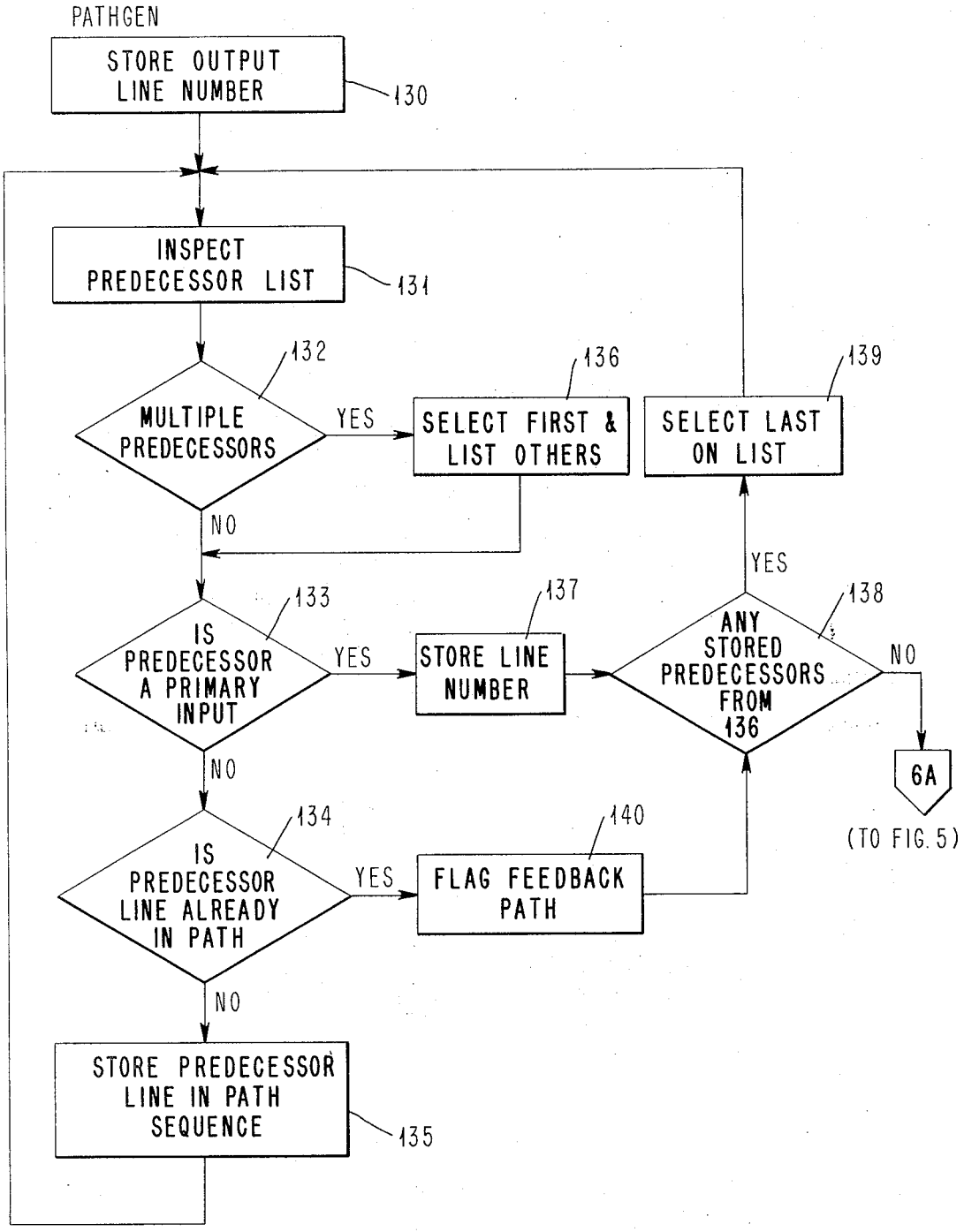

DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED JULY 2, 1974

924 O.G. 8

T924,006

FUNCTIONAL TEST METHOD FOR ASYNCHRONOUS SEQUENTIAL CIRCUITS

Dennis K. Chia, Wappingers Falls, and Se-June Hong, Mu-Yue Hsiao, and Darryl S. Jones, Poughkeepsie, N.Y., and Jung W. Cho, 8820 Root St., Apt. 4, Niles, Ill. 60648

Continuation of abandoned application Ser. No. 256,554, May 24, 1972. This application Oct. 3, 1973, Ser. No. 403,144

**Int. Cl. G06f *11/00***

U.S. Cl. 235—153 AC

5 Sheets Drawing. 24 Pages Specification

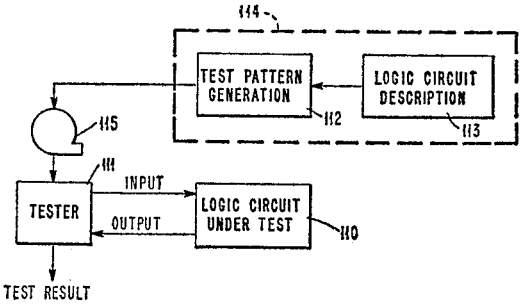

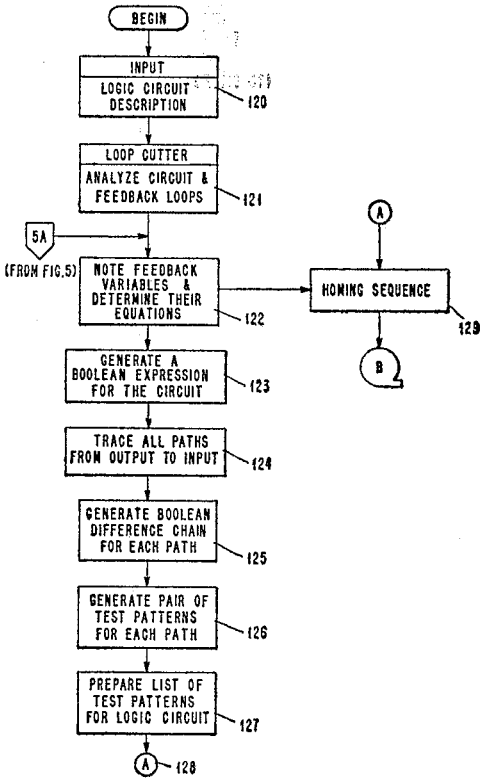

A method for testing physical sequential logic circuits including a program step for controlling a computer to generate test patterns for use in locating permanent faults in physical sequential logic circuits built for use in digital equipment by providing a method for finding feedback loops and identifying an appropriate line in the loop to (Table continued on page 2)

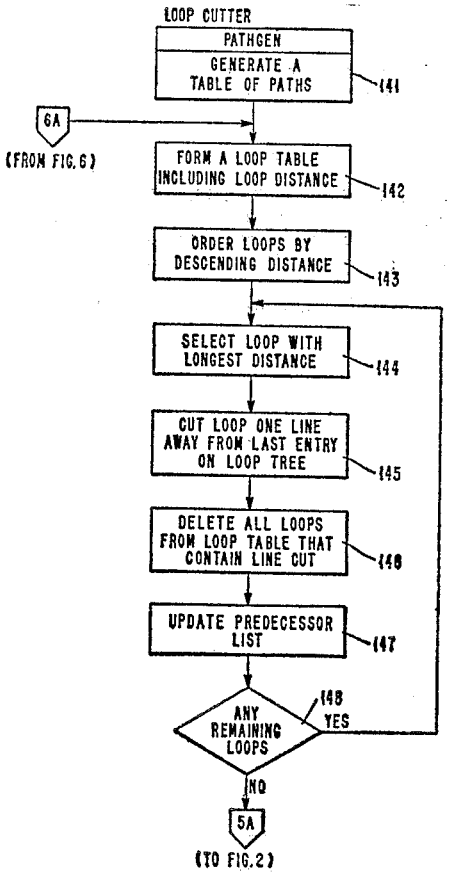

cut, at least figuratively, in order to convert a representation of the physical sequential circuit to a representation of an equivalent combinational circuit, analyzing the resultant combinational circuit representation according to specific boolean rules to obtain a complete set of test pat-

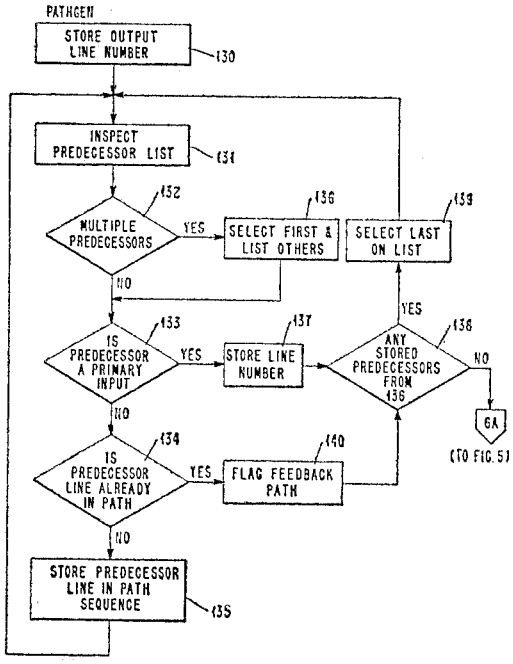

terns, and applying the test patterns to the physical sequential circuit.

FUNCTIONAL TEST METHOD FOR ASYNCHRONOUS SEQUENTIAL CIRCUITS

Original Filed May 24, 1972 5 Sheets-Sheet 1

FUNCTIONAL TEST METHOD FOR ASYNCHRONOUS SEQUENTIAL CIRCUITS

Original Filed May 24, 1972 5 Sheets-Sheet 2

FUNCTIONAL TEST METHOD FOR ASYNCHRONOUS SEQUENTIAL CIRCUITS

Original Filed May 24, 1972 5 Sheets-Sheet 3

FUNCTIONAL TEST METHOD FOR ASYNCHRONOUS SEQUENTIAL CIRCUITS

Original Filed May 24, 1972 5 Sheets-Sheet 4

FUNCTIONAL TEST METHOD FOR ASYNCHRONOUS SEQUENTIAL CIRCUITS

Original Filed May 24, 1972 5 Sheets-Sheet 5